(12) United States Patent
Noethlings et al.

(10) Patent No.: US 10,763,977 B2
(45) Date of Patent: Sep. 1, 2020

(54) DEVICE AND METHOD FOR DETERMINING A DC COMPONENT

(71) Applicant: Sony CORPORATION, Tokyo (JP)

(72) Inventors: Rolf Noethlings, Stuttgart (DE); Norihito Mihota, Stuttgart (DE)

(73) Assignee: SONY CORPORATION, Tokyo (JP)

( * ) Notice: Subject to any disclaimer, the term of this patent is extended or adjusted under 35 U.S.C. 154(b) by 195 days.

(21) Appl. No.: 15/556,677

(22) PCT Filed: Mar. 9, 2016

(86) PCT No.: PCT/EP2016/055022
§ 371 (c)(1),
(2) Date: Sep. 8, 2017

(87) PCT Pub. No.: WO2016/142424
PCT Pub. Date: Sep. 15, 2016

(65) Prior Publication Data
US 2018/0054262 A1      Feb. 22, 2018

(30) Foreign Application Priority Data

Mar. 9, 2015 (EP) .................................... 15158207

(51) Int. Cl.
*H04B 17/10* (2015.01)
*G01S 13/36* (2006.01)
(Continued)

(52) U.S. Cl.
CPC .......... *H04B 17/104* (2015.01); *G01S 7/4861* (2013.01); *G01S 13/36* (2013.01);
(Continued)

(58) Field of Classification Search
CPC ......... G01S 7/352; G01S 7/03; H04B 1/4075; H04B 25/062; H03C 1/52
See application file for complete search history.

(56) References Cited

U.S. PATENT DOCUMENTS 3,953,805 A * 4/1976 Couvillon ................. G01S 7/28
327/307
4,811,425 A * 3/1989 Feerst .................... H03D 7/165
455/209
(Continued)

FOREIGN PATENT DOCUMENTS

EP       0 598 277 A1      5/1994
EP       1262793 A1 * 12/2002 ............. G01S 7/352
(Continued)

OTHER PUBLICATIONS

Graham M. Brooker, "Understanding Millimetre Wave FMCW Radars," 1st International Conference on Sensing Technology, Nov. 21-23, 2005, Palmerston North, New Zealand, pp. 152-157.
(Continued)

*Primary Examiner* — Bernarr E Gregory
(74) *Attorney, Agent, or Firm* — Xsensus LLP

(57) ABSTRACT

A device for determining a DC component in a zero-IF radio receiver comprises an input configured to receive a complex baseband signal; and an analyzer configured to analyze the complex baseband signal to determine a DC component in the complex baseband signal by selecting at least three samples of the complex baseband signal and determining the intersection of at least two perpendicular bisectors of at least two straight lines, each straight line running through a different pair of two of said selected samples, said intersection representing the DC component. Further, a corresponding method, a radar device and a radar method are disclosed.

17 Claims, 7 Drawing Sheets

(51) Int. Cl.
  *G01S 7/4861* (2020.01)
  *H04L 25/06* (2006.01)
  *H03D 3/00* (2006.01)
  *H04B 1/30* (2006.01)
  *G01S 13/00* (2006.01)

(52) U.S. Cl.
  CPC .............. *H03D 3/008* (2013.01); *H04B 1/30* (2013.01); *H04L 25/061* (2013.01); *H04B 2001/305* (2013.01)

(56) References Cited

U.S. PATENT DOCUMENTS

| | | | | |
|---|---|---|---|---|
| 5,162,763 A * | 11/1992 | Morris | .................... | H03C 1/60 332/170 |
| 5,241,702 A * | 8/1993 | Dent | .................... | H03D 3/008 329/325 |
| 5,422,889 A * | 6/1995 | Sevenhans | ............. | H03D 3/008 370/442 |
| 5,442,655 A * | 8/1995 | Dedic | .................... | H04L 25/06 329/353 |
| 5,584,059 A * | 12/1996 | Turney | .................... | H03C 1/06 375/296 |
| 5,793,817 A * | 8/1998 | Wilson | .................... | H03C 1/52 330/107 |
| 5,838,735 A * | 11/1998 | Khullar | ................ | H04L 25/062 375/319 |
| 6,009,126 A * | 12/1999 | Van Bezooijen | ........ | H04B 1/30 329/304 |
| 6,654,596 B1 | 11/2003 | Jakobsson et al. | | |
| 6,735,422 B1 * | 5/2004 | Baldwin | .................. | H04B 1/30 455/232.1 |
| 6,907,235 B2 * | 6/2005 | Lisenbee | .................. | H04B 1/30 375/346 |
| 7,110,734 B2 * | 9/2006 | Mohindra | ................ | H04B 1/30 455/234.1 |
| 7,369,820 B2 * | 5/2008 | Rahman | ............... | H04B 1/0475 375/297 |
| 7,376,200 B2 * | 5/2008 | Demir | ..................... | H04B 1/30 375/296 |
| 7,457,374 B2 * | 11/2008 | Beyer | ..................... | H04B 1/30 375/319 |
| 7,505,744 B1 * | 3/2009 | Shan | ........................ | H04B 1/30 375/319 |
| 8,019,311 B2 | 9/2011 | Nekhamkin et al. | | |
| 9,086,485 B2 * | 7/2015 | Himmelstoss | ............ | G01S 7/03 |
| 2003/0174079 A1 * | 9/2003 | Soltanian | ................. | H04B 1/30 341/118 |
| 2004/0082302 A1 | 4/2004 | Shippee | | |
| 2005/0136868 A1 * | 6/2005 | Jun | .......................... | H04B 1/30 455/127.1 |
| 2006/0239388 A1 * | 10/2006 | Beamish | ................. | H04B 1/30 375/346 |
| 2009/0325532 A1 | 12/2009 | Nekhamkin et al. | | |
| 2014/0307834 A1 * | 10/2014 | Young | .................. | H04L 25/061 375/319 |

FOREIGN PATENT DOCUMENTS

WO  00/45523 A2  8/2000
WO  2009/158023 A1  12/2009

OTHER PUBLICATIONS

International Search Report and Written Opinion dated Jul. 26, 2016 in PCT/EP2016/055022 filed Mar. 9, 2016.

\* cited by examiner

DEVICE AND METHOD FOR DETERMINING A DC COMPONENT

CROSS-REFERENCE TO RELATED APPLICATIONS

The present application claims priority to European Patent Application 15158207.9 filed in the European Patent Office on Mar. 9, 2015, the entire contents of which are incorporated herein by reference.

BACKGROUND

Field of the Disclosure

The present disclosure relates to a device and method for determining a DC component in a zero-IF receiver, in particular for use in DC compensation. The present disclosure relates further to a radar system and a radar method for distance determination. Finally, the present disclosure relates to a non-transitory computer-readable recording medium.

Description of Related Art

Zero-IF (Intermediate Frequency) architectures directly convert an RF signal into the complex baseband domain. This has some advantages compared to low-IF architectures: the analogue filter in front of an AD converter can be designed narrower, which relaxes the requirements regarding headroom of the AD converter in severe adjacent channel scenarios. Moreover, the conversion step from low-IF to the complex baseband is obsolete. Tuners, especially a local oscillator (LO) provided within tuners, however, introduce a (strong) DC component to the low-IF/zero-IF signal. In low-IF this DC is outside of the wanted signal range and can easily be filtered. In zero-IF this DC interferes with the wanted signal and needs to be compensated. For signals of some modulations this is easy, but e.g. for phase-modulated signals (e.g. FM) no easy spectrum or time based DC estimation is possible.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present disclosure.

SUMMARY

It is an object to provide a device and method for efficient determination of a DC component, in particular for DC compensation, in a zero-IF receiver. It is a further object to provide a radar system and a radar method for accurate distance determination. It is a still further objection to provide a computer program and a non-transitory computer-readable recording medium for implementing the disclosed methods.

According to an aspect there is provided a device for determining a DC component in a zero-IF receiver, said device comprising:

an input configured to receive a complex baseband signal; and an analyzer configured to analyze the complex baseband signal to determine a DC component in the complex baseband signal by selecting at least three samples of the complex baseband signal and determining the intersection of at least two perpendicular bisectors of at least two straight lines, each straight line running through a different pair of two of said selected samples, said intersection representing the DC component.

According to a further aspect there is provided a radar device for distance determination, said system comprising:

a radar device configured to transmit a Tx radar signal to a scene and to receive a Rx radar signal from the scene due to reflection of the Tx radar signal from one or more objects;

a down-converter configured to down-convert the Rx radar signal to a complex baseband signal;

a DC compensation device comprising an input configured to receive the complex baseband signal, an analyzer configured to analyze the complex baseband signal to determine a DC component in the complex baseband signal, and a DC compensator configured to subtract the determined DC component from samples of the complex baseband signal to compensate the DC component and to obtain a reconstructed baseband signal; and a phase extraction unit configured to extract phase information from the reconstructed baseband signal representing distance information of the distance between the radar device and the one or more objects.

According to still further aspects a corresponding method for determining a DC component, a corresponding radar method, a computer program comprising program means for causing a computer to carry out the steps of a method disclosed herein, when said computer program is carried out on a computer, as well as a non-transitory computer-readable recording medium that stores therein a computer program product, which, when executed by a processor, causes a method disclosed herein to be performed are provided.

Further embodiments are defined in the dependent claims. It shall be understood that the disclosed radar device, the disclosed methods, the disclosed computer program and the disclosed computer-readable recording medium have similar and/or identical further embodiments as the claimed device for determining a DC component and as defined in the dependent claims.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
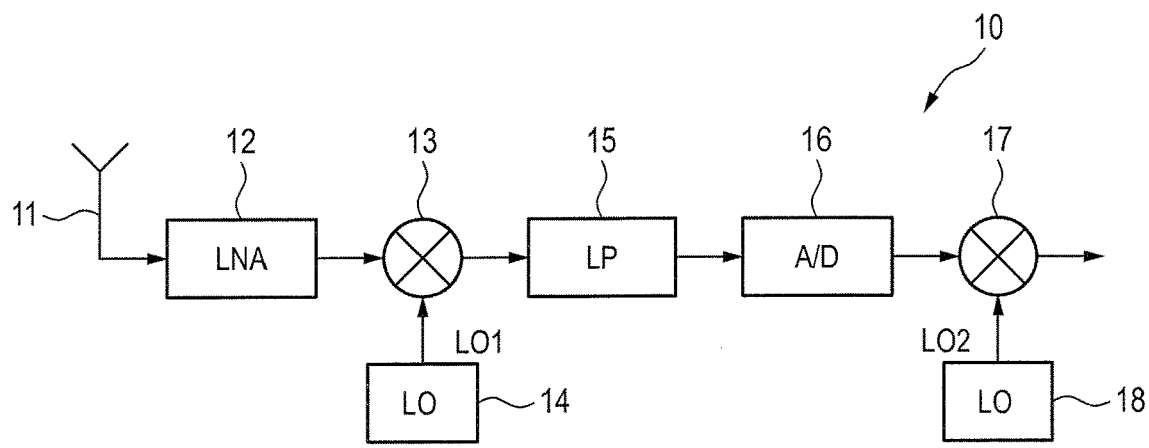
FIG. 1 shows a schematic diagram of a known low-IF receiver.

Referring now to the drawings, wherein like reference numerals designate identical or corresponding parts throughout the several views, FIG. 1 shows a schematic diagram of a known low-IF receiver 10, e.g. a digital radio broadcast receiver that receives radio broadcasting signals such as an FM receiver configured to process an analog FM signal. The low-IF receiver 10 comprises an antenna 11 for receiving the radio broadcast signal modulated at a carrier frequency and a low-noise amplifier (LNA) 12 for amplifying the signal. The received signal, which is generally a phase and/or frequency modulated signal, is input into a first mixer 13 for mixing it with a first local oscillator signal LO1 supplied by a first tunable local oscillator 14 to generate a low-IF signal at an intermediate frequency. The low-IF signal is low-pass filtered by a low-pass filter 15 to obtain a low-pass filtered signal, which is subsequently subjected to analog-to-digital conversion by analog-to-digital converter (ADC) 16. The obtained digital signal is then input to a second mixer 17 for mixing it with a second local oscillator signal LO2 supplied by a second tunable local oscillator 18 to generate a baseband signal at a baseband frequency. In an embodiment a complex IQ baseband signal is generated by the low-IF receiver 10.

Figure 2:
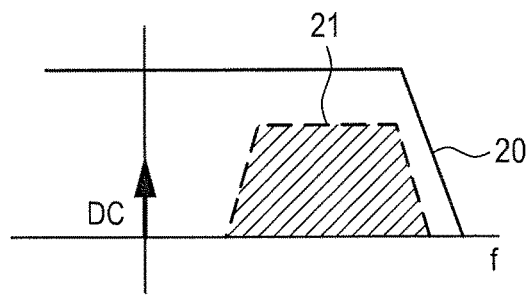
FIG. 2 shows a spectral diagram of various signals in the known low-IF receiver.

A spectral diagram of various signals in the known low-IF receiver 10 shown in FIG. 1 is depicted in FIG. 2. It shows particularly the low-pass filter curve 20 and the spectrum of the wanted signal 21.

Figure 3:
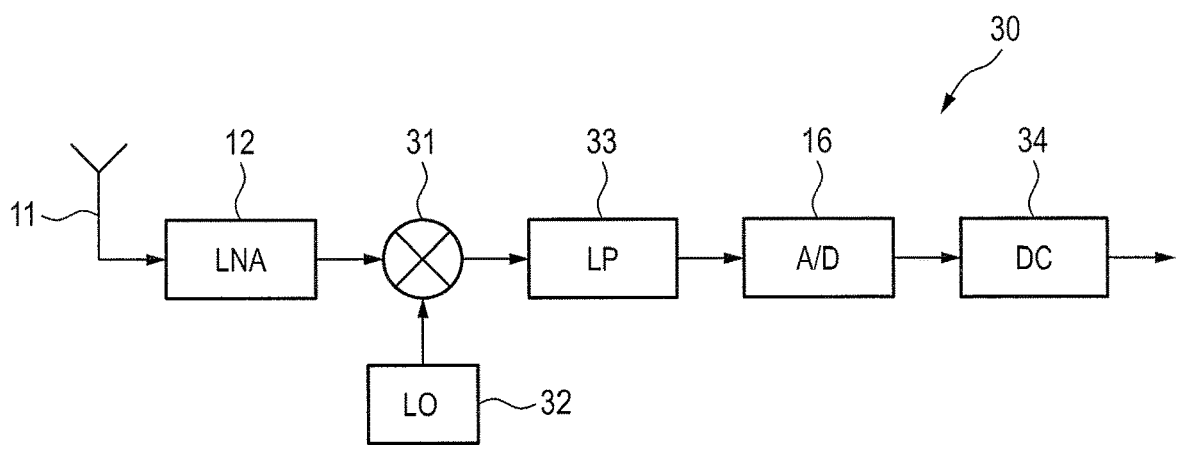
FIG. 3 shows a schematic diagram of an embodiment of a zero-IF receiver according to the present disclosure.

FIG. 3 shows a schematic diagram of an embodiment of a zero-IF receiver 30 according to the present disclosure. Compared to the low-IF receiver 10 shown in FIG. 1 the zero-IF receiver 30 comprises only a single mixer 31 for mixing it with a local oscillator signal LO supplied by a tunable local oscillator 32 to generate a baseband signal at a baseband frequency, which is subsequently low-pass filtered by low-pass filter 33 and analog-to-digital converted. Hence, a down-converter is provided for down-converting the received modulated radio frequency signal to a complex baseband signal.

Zero-IF systems directly sample the wanted signal in the complex baseband, which has some advantages. For zero-IF systems low-pass filters can be much narrower compared to low-pass filters in low-IF architectures. On the analog side a better adjacent channel reduction can be achieved. Further, a single mixer is sufficient. However, the analog RF signal processing produces a DC component. To compensate for the DC component a DC compensation unit 34 is provided according to the present disclosure for compensating the unwanted DC component.

Figure 4:
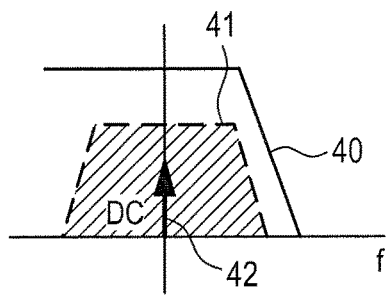
FIG. 4 shows a spectral diagram of various signals in the embodiment of the zero-IF receiver shown in FIG. 3.

As shown in the spectral diagram depicted in FIG. 4 the low-pass filter curve 40 of the low-pass filter 33 is narrower than the low-pass filter curve 20 in the low-IF receiver. Further, it can be seen that DC component 42 lies within the spectrum of the wanted signal 41, which is the reason for requiring the DC compensation.

Figure 5:
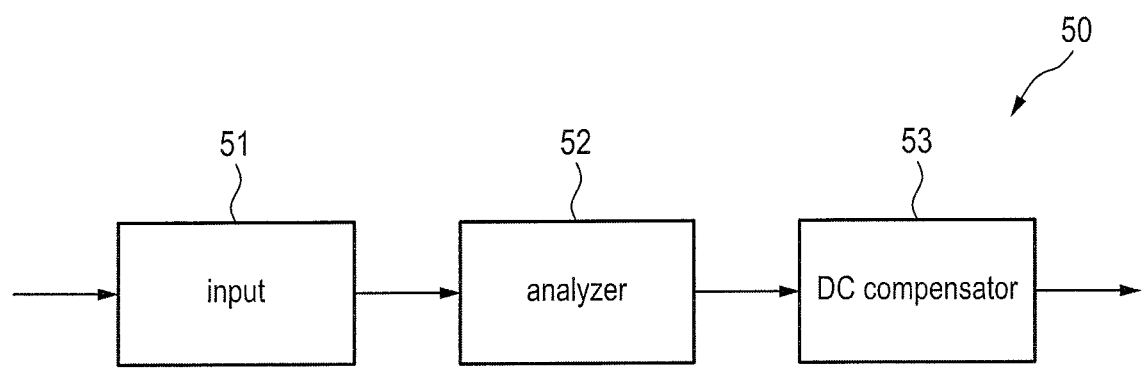
FIG. 5 shows a schematic diagram of an embodiment of a device for DC compensation including a device for determining a DC component according to the present disclosure.

FIG. 5 shows a schematic diagram of an embodiment of a device 50 for DC compensation according to the present disclosure, which may be used as DC compensation unit 34 in the zero-IF receiver 30 shown in FIG. 3. The device 50 comprises an input 51 configured to receive a complex baseband signal, e.g. the baseband signal output from the ADC 16 of the receiver 30. Further, an analyzer 52 is provided for analyzing the complex baseband signal to determine a DC component in the complex baseband signal. A DC compensator 53 subtracts the determined DC component from samples of the complex baseband signal to compensate the DC component and to obtain a reconstructed baseband signal. The input 51 and the analyzer 52 form a device for determining a DC component according to the present disclosure, also called device for DC estimation.

Figure 6:
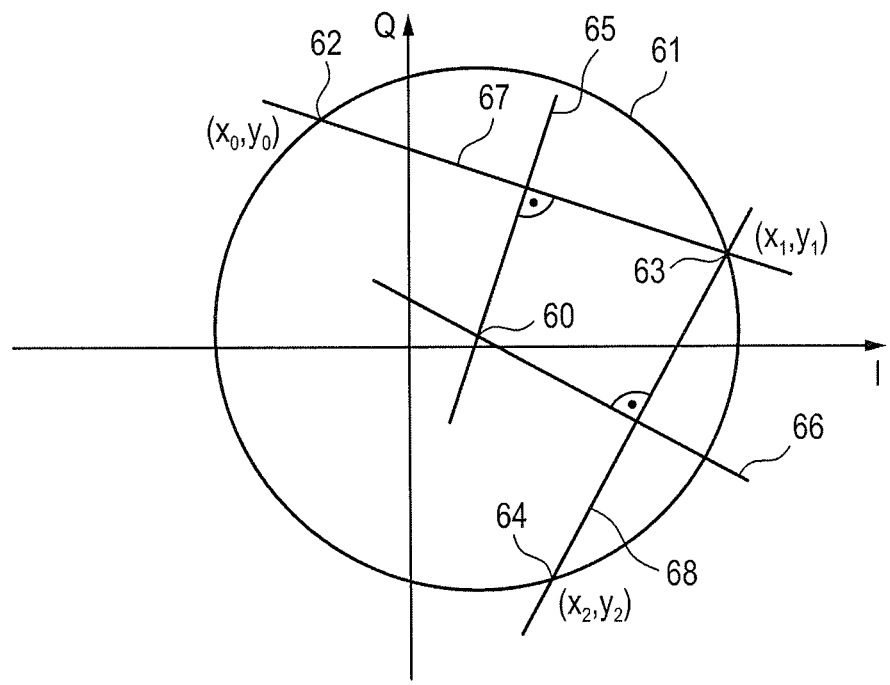
FIG. 6 shows a signal sample plot for illustrating the proposed determination of the DC component, FIG. 7, which is composed of FIGS. 7A and 7B, shows a schematic diagram of another embodiment of a device for determining a DC component according to the present disclosure.

The operation of the analyzer 52 shall be explained with reference to the diagram depicted in FIG. 6 showing a signal sample plot in the IQ domain. Ideally the complex (IQ) baseband signal of a phase modulated signal propagates on a circle. In the presence of a DC component this circle is shifted, and the DC component 60 is the center of the new (shifted) circle 61. The center of a circle can be calculated by three circle points 62, 63, 64, indicated by their coordinates in the IQ diagram as $(x_0, y_0)$, $(x_1, y_1)$, $(x_2, y_2)$. Hence, the analyzer 52 generally selects at least three samples 62, 63, 64 of the complex baseband signal and determines the intersection 60 of at least two perpendicular bisectors 65, 66 of at least two straight lines 67, 68, each straight line running through a different pair 62, 63 and 63, 64 of two of said selected samples, said intersection 60 representing the DC component.

This can be expressed mathematically as follows. The intersection of the two bisectors can be described by the following equation:

$$\begin{pmatrix} y_0 - y_1 \\ x_1 - x_0 \end{pmatrix} \alpha + 1/2 \begin{pmatrix} x_0 + x_1 \\ y_0 + y_1 \end{pmatrix} = \begin{pmatrix} y_2 - y_1 \\ x_1 - x_2 \end{pmatrix} \beta + 1/2 \begin{pmatrix} x_1 + x_2 \\ y_1 + y_2 \end{pmatrix}$$

representing a system of two equations with two unknowns, wherein $$\alpha = 1/2 \frac{(x_2 - x_0)(x_2 - x_1) - (y_2 - y_0)(y_1 - y_2)}{(y_0 - y_1)(x_2 - x_1) - (x_1 - x_0)(y_1 - y_2)}$$

The coordinates of the DC component in the IQ diagram thus result in:

$$DC = \begin{pmatrix} DC_I \\ DC_Q \end{pmatrix} =$$

$$1/2\left(\frac{y_0 - y_1}{x_1 - x_0}\right)\frac{(x_2 - x_0)(x_2 - x_1) - (y_2 - y_0)(y_1 - y_2)}{(y_0 - y_1)(x_2 - x_1) - (x_1 - x_0)(y_1 - y_2)} + 1/2\left(\frac{x_0 + x_1}{y_0 + y_1}\right)$$

As shown in FIG. 6, in an embodiment the DC component is determined by selecting exactly three samples of the complex baseband signal and determining the intersection of exactly two perpendicular bisectors of exactly two straight lines. Generally, however, more than three samples may be used as well. It is, for instance, possible to use four samples, wherein the two straight lines are formed through two pairs of samples, each pair using two different samples of said four samples.

For the selection of the at least three samples various advantageous embodiments exist. In one embodiment at least three samples of the complex baseband signal are selected, wherein each two of the selected samples are spaced by at least i samples, i being an integer larger than one. In other words, the samples 62, 63, 64 are not directly adjacent samples, but in between at least one (preferably more than one) sample are arranged which are not used for the definition of the straight lines. This provides that the samples used for defining the straight lines are not too close together, i.e. small sample distances are avoided, since the use of samples at small distances (e.g. all samples being arranged in the same quadrant of the IQ diagram) would lead to numerically more difficult calculations and a less accurate determination of the DC component. The number i may depend e.g. on the sampling rate, i.e. the higher the sampling rate, the bigger i should be. In an exemplary embodiment a value in the range between 2 and 10 (e.g. 4) may be used.

For the same reasons, the analyzer 52 is configured in an embodiment to select at least three samples of the complex baseband signal from at least three different quadrants in the IQ plane. This is also illustrated in FIG. 6, since the samples 62, 63, 64 are all located in different quadrants.

In still another embodiment the analyzer 52 is configured to select at least three samples of the complex baseband signal having a signal level above a predetermined signal level threshold. This avoids that samples in a "silence phase" are used, i.e. samples having a too low signal value which would also reduce the accuracy of the DC component determination. As signal value sqrt($I^2+Q^2$) may be used (I being the I value of the sample and Q being the Q value of the sample in the IQ diagram), e.g. to avoid fading drops. Hence, the signal value of samples used for the DC compensation should be sufficiently and constantly high; if the signal value drops, the samples are suspicious and should not be used for DC compensation.

Still further, in an embodiment the analyzer 52 is configured to select at least three samples of the complex baseband signal by use of an external quality signal. The external quality signal may e.g. be AGC, a noise indicator implemented in the signal, or a level indicator. In a digital case it could be a "loss of synchronization" indication, or a bit error rate (BER). In an exemplary implementation the selection of samples is achieved by skipping "low quality samples".

Figure 7A:
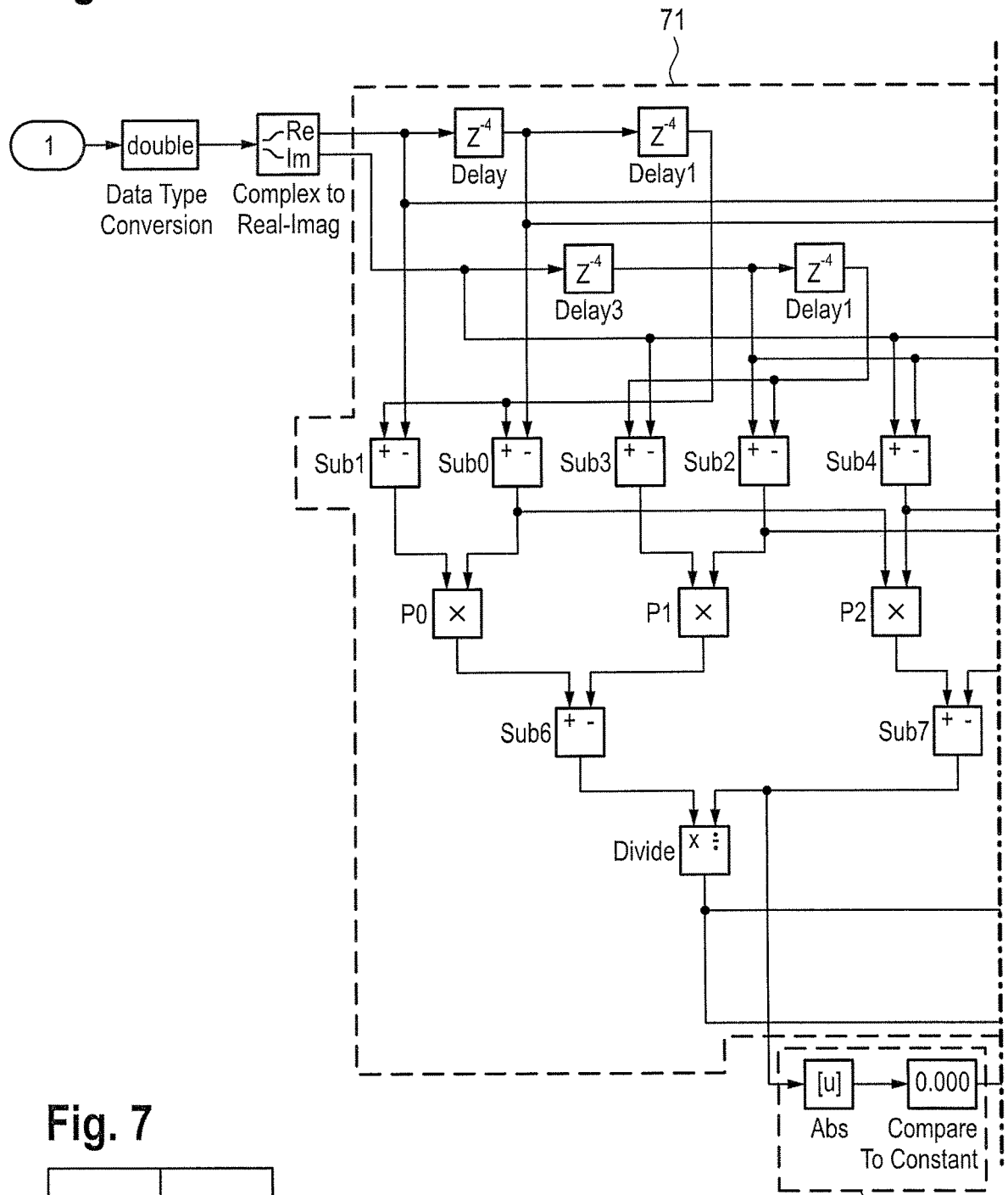
Figure 7:
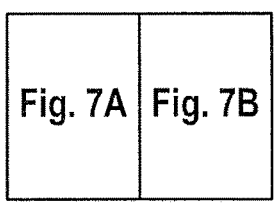
Figure 7B:
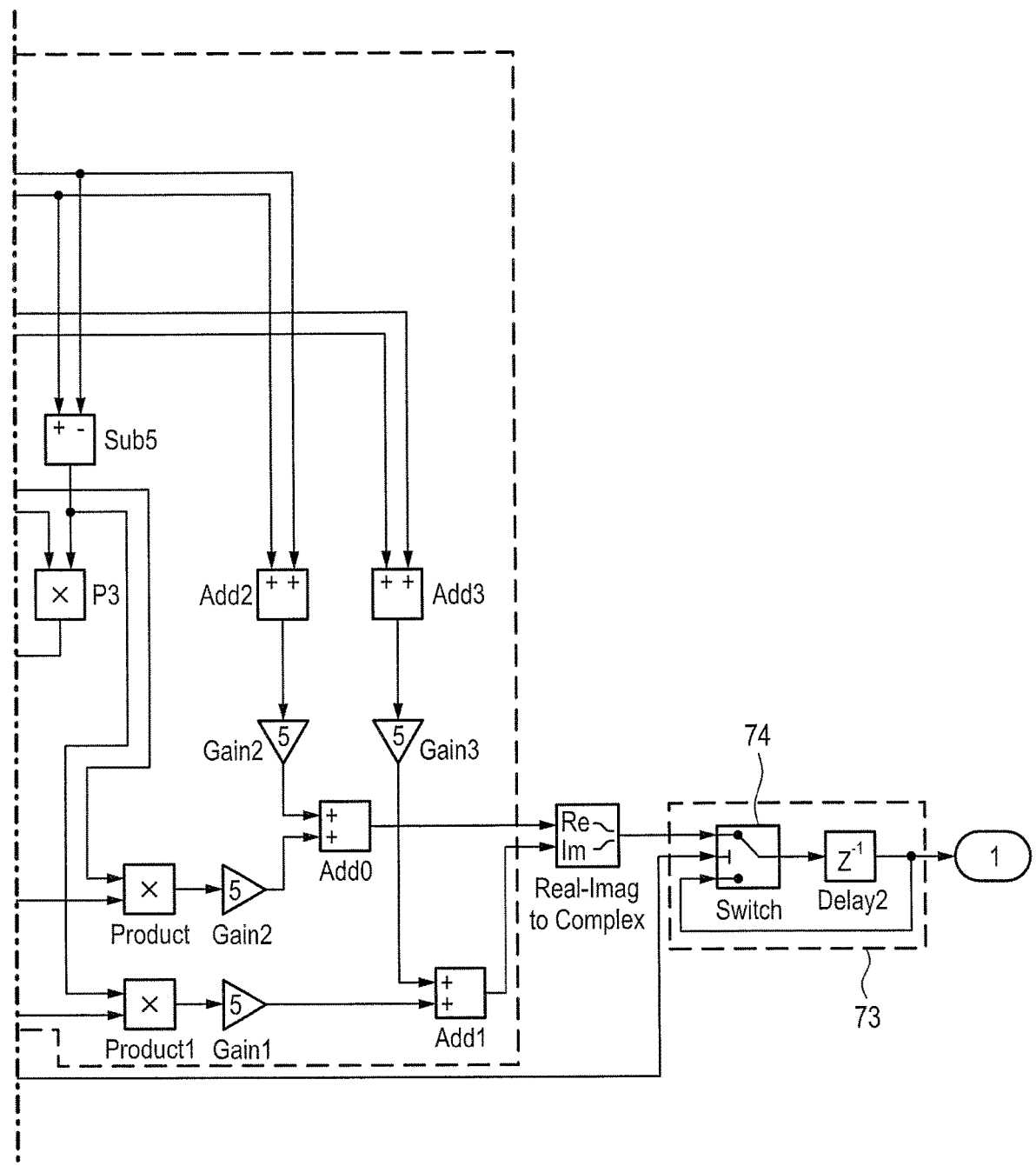

FIG. 7, which is composed of FIGS. 7A and 7B, shows a more detailed schematic diagram of another embodiment of a device 70 for DC compensation according to the present disclosure. Block 71 of this device 70 substantially implements the above explained formula for determining the DC component, i.e. block 71 represents part of the analyzer 52. As can be seen this block 71 comprises a single divider only, all other elements can be realized by adders, multipliers and delay units. Hence, the implementation of block 71 can be achieved with simple components only or with one or more processors.

The device 70 further comprises means for performing a plausibility check, which are also part of the analyzer 52. Said means perform a plausibility check for checking the plausibility of the determined DC component and for skipping a determined DC component in case it is determined to be implausible. Block 72 particularly performs a plausibility check by checking if the absolute value of a denominator used in the determination of the DC component, in particular the denominator in the above shown equation for determining the DC component, is below a predetermined DC component threshold. If the denominator is below the DC component threshold, the calculated DC component value is considered to be implausible and will be skipped; otherwise, it will be accepted and used for subsequent DC compensation. Block 73 executes the result of the plausibility check performed in block 72, particularly by controlling the switch 74. If a determined DC component value shall be skipped, the previous DC component value is kept and used for DC compensation. Otherwise, the determined DC component value is used for the next DC compensation. Hence, the algorithm for determining the DC component and for DC compensation may be continuously or regularly performed, rather than only a single time or only after longer time intervals. In other words, both the calculation of the DC component and the DC compensation may be performed adaptively.

In another embodiment the analyzer 52 is configured to perform a weighted low-pass filtering of two or more subsequently determined DC components, wherein the weight may be determined based on the reliability and/or plausibility of the respective DC components. For instance, the filtering is performed such that the DC component value does not "jump", but may only be noisy, what is mitigated by this low-pass filtering. The filtering may also be performed such that the DC component is not outside of the selected samples, i.e. such that the absolute value of the DC component is smaller than each respective signal value of the selected samples. Checking the DC against the selected sample is (another) plausibility check, in order to judge or skip single DC estimations.

In an embodiment the analyzer 52 is configured to average subsequently determined DC components, which may also be considered as a special case of weighted filtering using e.g. equal weights or equal taps in the filter. The averaging may e.g. apply moving averaging (i.e. a time shifted version of averaging), moving averaging with selected determined DC components or weighted averaging (using e.g. the same criteria as explained above for the plausibility check).

The disclosed way of determining a DC component for DC compensation may also be used for carrier interference compensation, i.e. the expression "DC compensation" shall be understood as including the compensation of one or more interfering carriers, which shall be suppressed. This is particularly useful if an interfering carrier is close to a carrier of the wanted signal.

Figure 8:
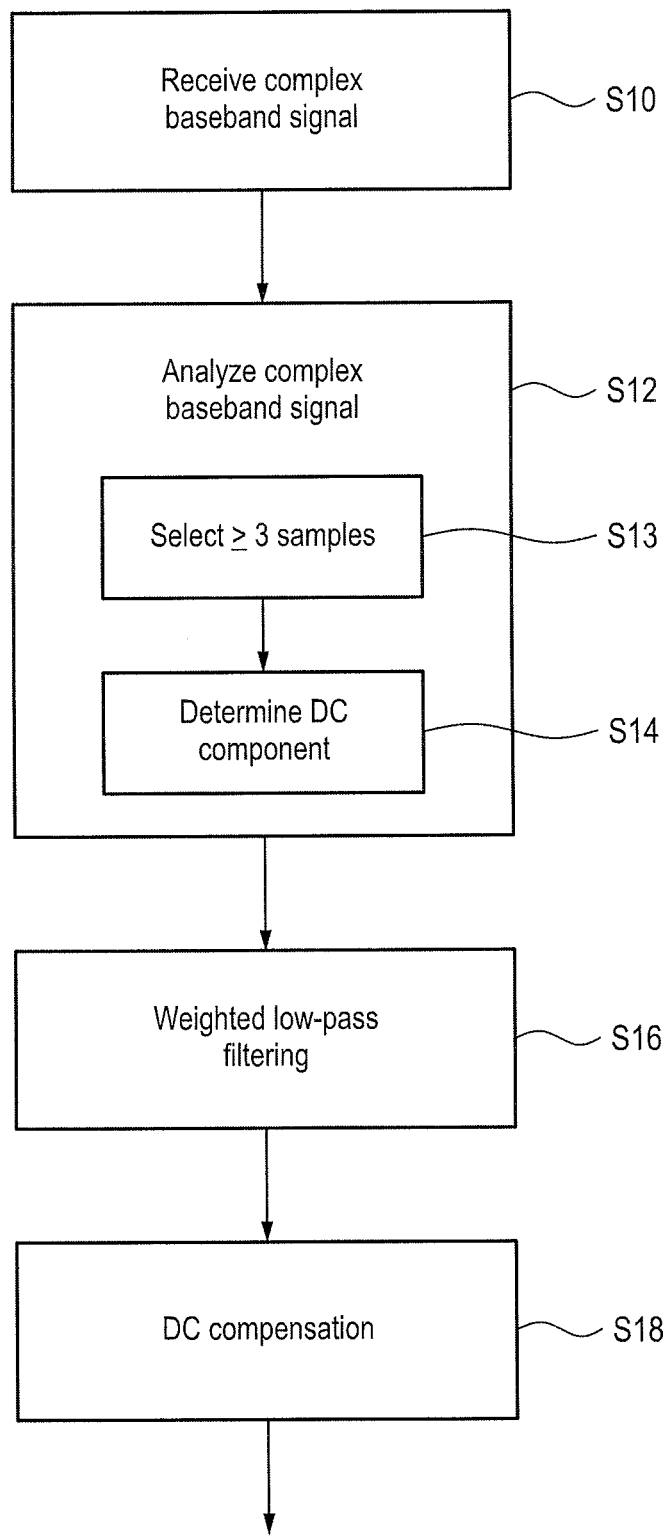
FIG. 8 shows a flowchart of an embodiment of a method for DC compensation according to the present disclosure.

FIG. 8 shows a flowchart of an embodiment of a method for DC compensation according to the present disclosure, wherein the steps S10 to S16 represent a method for DC estimation, in which the step S18 is optional. In a first step S10 a complex baseband signal is received, which—in a zero-IF receiver—is generated from a frequency and/or phase modulated RF signal. In a second step S12 the complex baseband signal is analyzed as explained above to determine a DC component in the complex baseband signal. This second step comprises a first sub-step S13 of selecting at least three samples of the complex baseband signal, which lie on a circle in the complex IQ plane, and a second sub-step S14 of determining the intersection of at least two perpendicular bisectors of at least two straight lines, each straight line running through a different pair of two of said selected samples, said intersection representing the DC component. In a third step S16 a weighted low-pass filtering of the latest determined DC components is applied considering likelihood, reliability and/or trustworthiness. For instance, if a DC component is considered to be unreliable, it is skipped and not used for DC estimation and, optionally, DC compensation (i.e. gets weight zero in the weighted low-pass filter), while a reliable DC component will subsequently be used for DC estimation and, optionally, DC compensation (i.e. gets big weight in the weighted low-pass filter). In a fourth step S18, the DC component determined from the samples of the complex baseband signal is used to compensate the DC component and to obtain a reconstructed baseband signal.

One field of application of the DC compensation according to the present disclosure is in a zero-IF receiver for receiving digital broadcast signals. However, DC compensation may also be used in other applications, such as in a radar system for distance determination, as e.g. used for measuring the distance of objects, particularly of moving objects, in a scene from the radar system. Such a radar system may e.g. be used for determining vital signs of a subject (a person or an animal), particularly for determining the heart rate and/or respiration rate, since heart beat and respiration cause periodic movements of the chest wall and (for respiration) the belly portion, which movements can be detected by use of a radar system.

Figure 9:
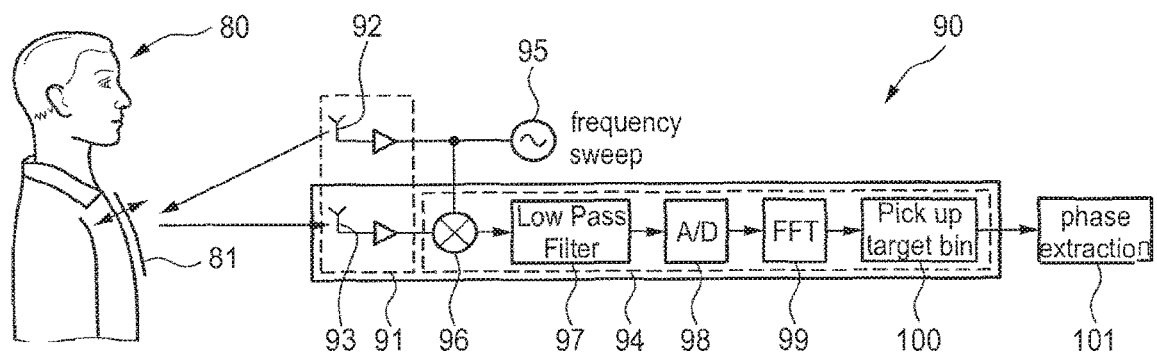
FIG. 9 shows a schematic diagram of a known radar system.

A schematic diagram of an embodiment of a known radar system 90 for vital signs determination is depicted in FIG. 9. It is configured to detect a periodic movement of the chest wall 80 of a person 81, said movement being caused by respiration and/or heart beat (which can generally be distinguished by a frequency analysis of the measured signals since they typically have different frequencies). The radar system 90 comprises a radar device 91 configured to transmit a Tx radar signal to a scene (here the subject 80) and to receive a Rx radar signal from the scene due to reflection of the Tx radar signal from one or more objects (the subject 80 in this example). In this example the radar device 91 comprises a transmit antenna 92 and a receive antenna 93, in other embodiments a common (collocated) antenna may be used instead. Further, the radar system 90 comprises a down-converter 94 configured to down-convert the Rx radar signal to a complex baseband signal.

In this embodiment the known FMCW (Frequency Modulated Continuous Wave) radar principle is used. A thorough explanation of FMCW is given in G. Brooker, "Understanding Millimeter Wave FMCW Radars", 1st International Conference on Sensing Technology, Nov. 21-23, 2005, Palmerston North, New Zealand, p. 152-157. An FMCW radar transmits a continuous wave signal that is frequency modulated (frequency is changing with time) to produce a chirp pulse by a chirp transmitter 95. This is transmitted to the object (here the subject 80) to be examined by the transmit antenna 92 and is also fed to the receiver chain (i.e. the down-converter 94), e.g. via a coupler. Depending upon the properties of the object the transmitted signal will be reflected by the object and be received by the receiver antenna 93. A duplexer or circulator may be used in case of using a collocated antenna to provide time multiplexing the transmitting and receiving signals to/from the collocated antenna.

Since the transmitted chirp pulse is changing its frequency with time, the exact frequency received for a given time instant depends upon how far away the object is located and the corresponding flight time (Tp). This received signal is then mixed with the transmitted chirp (supplied to the mixer 96) and the output of the mixer 96 has a frequency which is the difference in frequency between the transmitted and received signal. This is known as the beat frequency ($f_b$) and is directly proportional to the distance between the FMCW radar and the object, in this application the distance between the radar device 91 and the chest wall 81. The beat frequency signal is then preferably low-pass filtered by a low-pass filter 97, A/D converted in an A/D converter 98, and Fourier transformed in an FFT unit 99 to get each frequency bin. These frequency bins are directly related to the distance of the chest wall. In a processing unit 100 the desired target (distance) bin is evaluated to obtain the desired respiration rate and/or heart rate.

Figure 10:
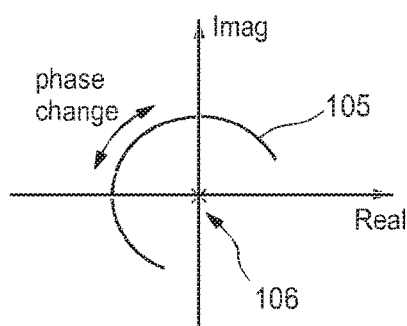
FIG. 10 shows a signal sample plot for illustrating the effect of phase changes in a known radar system.

The distance change of a reflected signal causes a phase change (modulation) in the output signal of the down-converter 94. A phase extraction unit 101 is thus provided to extract phase information from the output signal of the down-converter 94 representing distance information of the distance between the radar device and the one or more objects, here between the radar device 91 and the chest wall 81 of the subject 80. The phase is also illustrated in the signal diagram depicted in FIG. 10 showing an IQ diagram (I being denoted as Real (real part) and Q being denoted as Imag (imaginary part) here). The phase change caused by respiration and/or heart beat causes a movement of the complex output signal of the down-converter 94 to move on a circle 105 around the origin 106 representing the center of the phase change circle.

Figure 11:
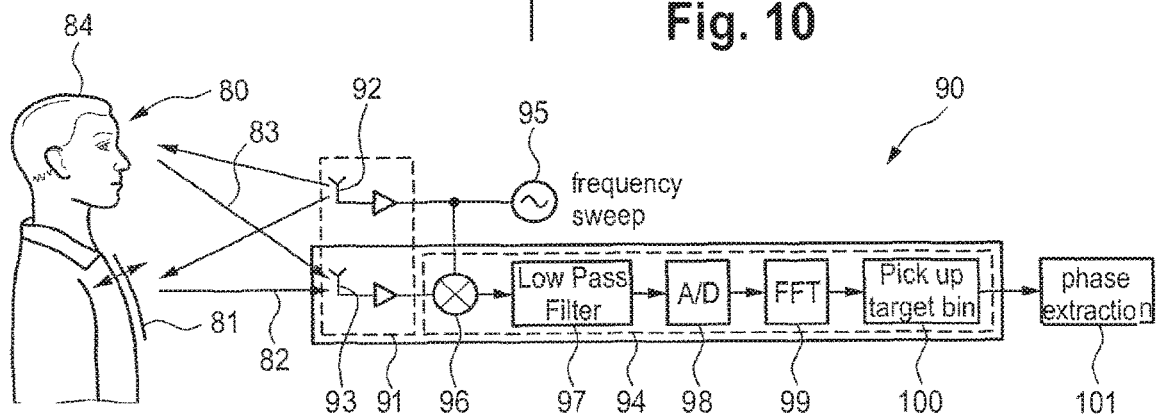
FIG. 11 shows a schematic diagram of the known radar system receiving several reflections.
Figure 12A:
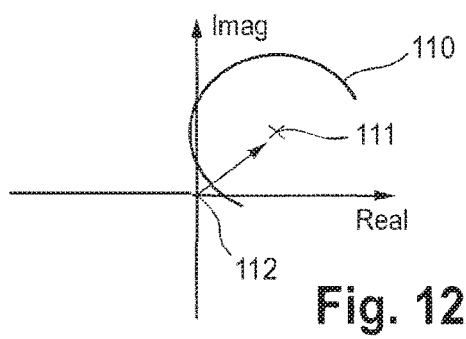
FIG. 12 shows a signal sample plots for illustrating the effect of several reflections in the known radar system.
Figure 12B:
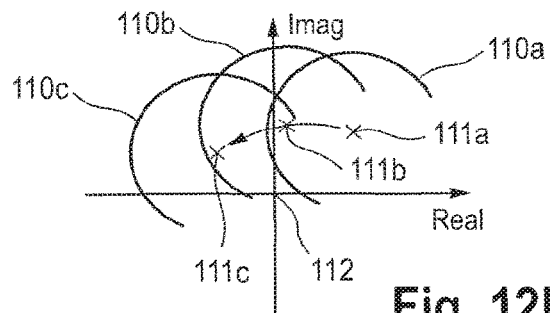

FIG. 11 shows a schematic diagram of the known radar system 90 receiving several reflections from the subject 80. As shown, a first reflection 82 is received from the chest wall, as desired. However, a second reflection 83 at substantially the same distance as the first reflection 82 is received from the head 84 of the subject 80. This lease to a mistake or an inaccuracy in the phase extraction since the second reflection 83 causes a DC offset in the output signal of the down-converter 94. This is illustrated in the signal sample plot shown in FIG. 12A, where the center 111 of the circle 110 is shifted away from the origin 112, said center 111 representing the unwanted DC component. This DC offset may even change due to a movement of the reflection, e.g. caused by movement of the body part of the subject causing a reflection, which causes the DC offsets 111a, 111b, 111c and the circles 110a, 110b, 110c to move in the IQ diagram as illustrated in the signal plot depicted in FIG. 12B.

Figure 13:
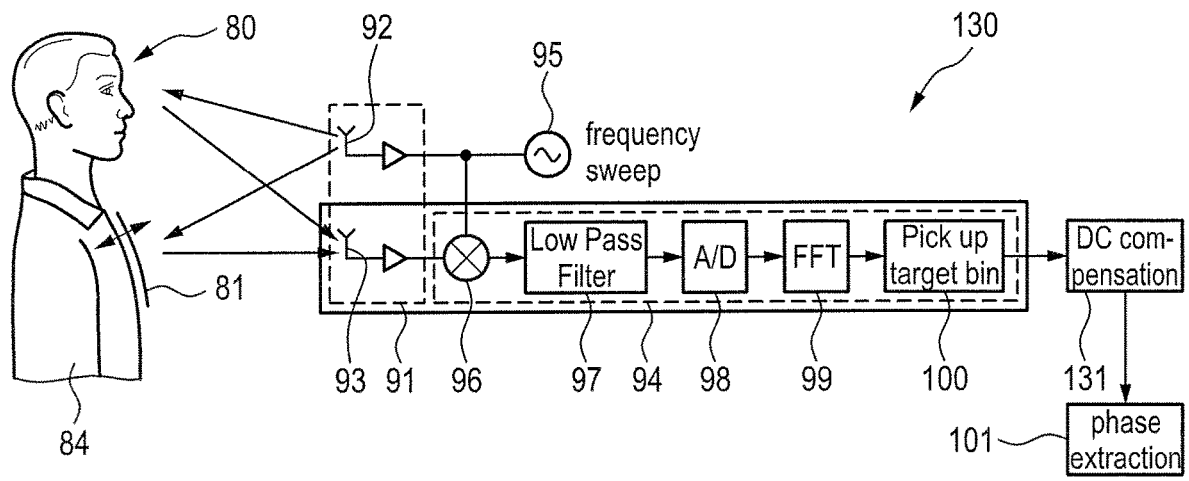
FIG. 13 shows a schematic diagram of a radar system according to the present disclosure.
Figure 14:
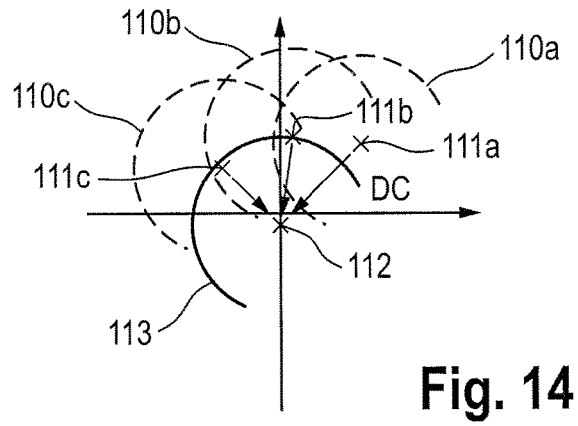
FIG. 14 shows a signal sample plot for illustrating the effect of DC compensation in the radar system according to the present disclosure.

FIG. 13 shows a schematic diagram of a radar system 130 according to the present disclosure which is configured to compensate the DC offset in the known radar system explained with reference to FIGS. 11 and 12. In this embodiment the radar system, in addition to the elements of the known radar system 90, comprises a DC compensation unit 131. The DC compensation unit 131 compensates the DC offset adaptively so that the subsequent phase extraction in the phase extraction unit 101 works correctly. In other words, as illustrated in the signal plot shown in FIG. 14, the DC compensation unit 131 provides that the centers 111a, 111b, 111c of the circle 110a, 110b, 110c are shifted to the origin 112, so that the phase moves along the circle 113 around the origin 112.

Generally, any DC compensation unit can be used in the proposed radar system 130. Such a DC compensation unit is depicted in FIG. 5 and generally comprises an input 51 configured to receive the complex baseband signal, an analyzer 52 configured to analyze the complex baseband signal to determine a DC component in the complex baseband signal, and a DC compensator 53 configured to subtract the determined DC component from samples of the complex baseband signal to compensate the DC component and to obtain a reconstructed baseband signal. In an embodiment a DC compensation device as explained above, particularly with reference to FIGS. 6 to 8 may be used as DC compensation unit 131 in the proposed radar system 130.

The various embodiments explained above for the DC compensation device may also be used in further embodiments of the proposed radar system 130. Further, as explained above, in an embodiment the phase extraction unit 101 is configured to determine a vital sign, in particular the respiration rate and/or the pulse rate, of a subject in the scene from phase information in the reconstructed baseband signal caused by periodic motion of one or more body parts.

Figure 15:
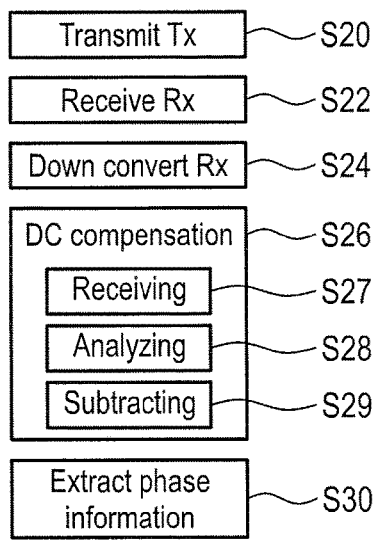
FIG. 15 shows a flowchart of a radar method for distance determination according to the present disclosure.

A flowchart of a radar method for distance determination according to the present disclosure is depicted in FIG. 15. In a first step S20 a Tx radar signal is transmitted to a scene. In a second step S22 a Rx radar signal is received from the scene due to reflection of the Tx radar signal from one or more objects. In a third step S24 the Rx radar signal is down-converted to a complex baseband signal. In a fourth step S26 a DC compensation method is applied. Said fourth step S26 comprises a first sub-step S27 of receiving the complex baseband signal, a second sub-step S28 of analyzing the complex baseband signal to determine a DC component in the complex baseband signal, and a third sub-step S29 of subtracting the determined DC component from the samples of the complex baseband signal to compensate the DC component and to obtain a reconstructed baseband signal. In a fifth step S30 phase information is extracted from the reconstructed baseband signal representing distance information of the distance between the radar device and the one or more objects.

One of the aspects of the disclosure is to make use of the knowledge that the complex baseband signal of undistorted phase modulated signals describes a circle. In case a DC is added, this circle shifts its center. A center of a circle can be easily derived from three circle points, i.e. three signal samples. The center of a circle is the interception point of two perpendicular bisectors.

There are several embodiments which improve this general approach in a streaming signal. In an embodiment numerical problems are anticipated: when the signal is oversampled or during period of low modulation, three consecutive samples of the modulated radio frequency signal may be very close to each other in the complex plane. This results in almost parallel perpendicular bisector, and the calculated intersection point is unreliable. This can be anticipated by taking not consecutive samples but every i-th sample (i being an integer larger than one). In another embodiment noise, which may have a heavy impact on the calculation, can be anticipate by applying a low-pass filter to the DC estimation output. Further, one or more plausibility checks can be introduced. For instance, when the denominator of a division is below a predetermined threshold, the estimated DC for that point in time is judged unreliable and skipped.

The disclosed device and method for DC estimation and compensation is of low complexity and requires only low computational effort, and thus is suited for low power circuits. A proper DC estimation and compensation is a pre-requisite to apply zero-IF receiver architectures, which have some advantage in terms of analogue filtering and dynamic range for the AD converter.

Moreover, the disclosed approach is also capable of compensating sinusoidal (e.g. carrier) interferers around the signal carrier, which result in a time-variant DC. Still further, the disclosed approach can also easily handle signals received through mobile channels. Fading effects (changing signal levels) influence the radius of the complex signal curve. The concept of perpendicular bisector is independent of changing signal level, as long as the changes in signal amplitude is slower than sampling three signal samples, which should be easily satisfied.

The disclosed device and method for DC compensation may be applied in different applications. One application is a radar device and method for distance determination, as for instance used for vital signs detection (e.g. detection of respiration rate and/or heart rate based on the monitoring of the movement of a body part of a subject, such as the chest or belly area). The disclosed radar device and method may even more generally apply any kind of DC compensation before the extraction of phase information from the reconstructed baseband signal representing distance information of the distance between the radar device and one or more objects in a scene. The use of DC compensation thus provide for a more accurate distance determination, e.g. a more accurate determination of vital signs if used in such an application.

Thus, the foregoing discussion discloses and describes merely exemplary embodiments of the present disclosure. As will be understood by those skilled in the art, the present disclosure may be embodied in other specific forms without departing from the spirit or essential characteristics thereof. Accordingly, the disclosure of the present disclosure is intended to be illustrative, but not limiting of the scope of the disclosure, as well as other claims. The disclosure, including any readily discernible variants of the teachings herein, defines, in part, the scope of the foregoing claim terminology such that no inventive subject matter is dedicated to the public.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure. Further, such a software may also be distributed in other forms, such as via the Internet or other wired or wireless telecommunication systems.

The elements of the disclosed devices, apparatus and systems may be implemented by corresponding hardware and/or software elements, for instance appropriated circuits. A circuit is a structural assemblage of electronic components including conventional circuit elements, integrated circuits including application specific integrated circuits, standard integrated circuits, application specific standard products, and field programmable gate arrays. Further a circuit includes central processing units, graphics processing units, and microprocessors which are programmed or configured according to software code. A circuit does not include pure software, although a circuit includes the above-described hardware executing software.

It follows a list of further embodiments of the disclosed subject matter:

1. A device for determining a DC component compensation in a zero-IF radio receiver, said device comprising:
   an input configured to receive a complex base band signal; and
   an analyzer configured to analyze the complex baseband signal to determine a DC component in the complex baseband signal by selecting at least three samples of the complex baseband signal and determining the intersection of at least two perpendicular bisectors of at least two straight lines, each straight line running through a different pair of two of said selected samples, said intersection representing the DC component.

2. The device as defined in embodiment 1, wherein said analyzer is configured to determine the DC component in the filtered baseband signal by selecting exactly three samples of the complex baseband signal and determining the intersection of exactly two perpendicular bisectors of exactly two straight lines.

3. The device as defined in embodiment 2, wherein said analyzer is configured to determine the DC component in the complex baseband signal by $$DC = \begin{pmatrix} DC_I \\ DC_Q \end{pmatrix} =$$

$$1/2 \begin{pmatrix} y_0 - y_1 \\ x_1 - x_0 \end{pmatrix} \frac{(x_2 - x_0)(x_2 - x_1) - (y_2 - y_0)(y_1 - y_2)}{(y_0 - y_1)(x_2 - x_1) - (x_1 - x_0)(y_1 - y_2)} + 1/2 \begin{pmatrix} x_0 + x_1 \\ y_0 + y_1 \end{pmatrix}$$

wherein $(x_0, y_0)$, $(x_1, y_1)$, $(x_2, y_2)$ are the complex coordinates of the selected samples in the IQ plane.

4. The device as defined in any preceding embodiment, wherein said analyzer is configured to select at least three samples of the complex baseband signal, wherein each two of the selected samples are spaced by at least i samples, i being an integer larger than one.

5. The device as defined in any preceding embodiment, wherein said analyzer is configured to select at least three samples of the complex baseband signal from at least three different quadrants in the IQ plane.

6. The device as defined in any preceding embodiment, wherein said analyzer is configured to select at least three samples of the complex baseband signal having a signal level above a predetermined signal level threshold.

7. The device as defined in any preceding embodiment, wherein said analyzer is configured to select at least three samples of the complex baseband signal by use of an external quality signal.

8. The device as defined in any preceding embodiment, wherein said analyzer is configured to perform a plausibility check for checking the plausibility of the determined DC component and for skipping a determined DC component in case it is determined to be implausible.

9. The device as defined in embodiment 8, wherein said analyzer is configured to perform said plausibility check by checking if the absolute value of a denominator used in the determination of the DC component is below a predetermined DC component threshold.

10. The device as defined in any preceding embodiment, wherein said analyzer is configured to perform a weighted low-pass filtering of two or more subsequently determined DC components, wherein the weight is determined based on the reliability and/or plausibility of the respective DC components.

11. The device as defined in embodiment 10, wherein said analyzer is configured to average subsequently determined DC components.

12. The device as defined in embodiment 11, wherein said analyzer is configured to apply moving averaging, moving averaging with selected determined DC components or weighted averaging.

13. The device as defined in any preceding embodiment, further comprising a DC compensator configured to subtract the determined DC component from samples of the complex baseband signal to compensate the DC component and to obtain a reconstructed baseband signal, in particular to adaptively compensate a DC component in the complex baseband signals.

14. A method for determining a DC component in a zero-IF radio receiver, said method comprising:
   receiving a complex baseband signal; and
   analyzing the complex baseband signal to determine a DC component in the complex baseband signal by selecting at least three samples of the complex baseband signal and determining the intersection of at least two perpendicular bisectors of at least two straight lines, each straight line running through a different pair of two of said selected samples, said intersection representing the DC component.

15. A radar system for distance determination, said system comprising:
   a radar device configured to transmit a Tx radar signal to a scene and to receive a Rx radar signal from the scene due to reflection of the Tx radar signal from one or more objects;
   a down-converter configured to down-convert the Rx radar signal to a complex baseband signal;
   a DC compensation device comprising
      an input configured to receive the complex baseband signal,
      an analyzer configured to analyze the complex baseband signal to determine a DC component in the complex baseband signal, and
      a DC compensator configured to subtract the determined DC component from samples of the complex baseband signal to compensate the DC component and to obtain a reconstructed baseband signal; and
   a phase extraction unit configured to extract phase information from the reconstructed baseband signal representing distance information of the distance between the radar device and the one or more objects.

16. The radar system as defined in embodiment 15, wherein said DC compensation device is a device as defined in embodiment 13.

17. The radar system as defined in embodiment 15 or 16, wherein said phase extraction unit is configured to determine a vital sign of a subject in the scene from phase information in the reconstructed baseband signal caused by periodic motion of one or more body parts.

18. The radar system as defined in embodiment 17, wherein said phase extraction unit is configured to determine the respiration rate and/or the pulse rate of a subject in the scene.

19. A radar method for distance determination, said method comprising:
   transmitting a Tx radar signal to a scene;
   receiving a Rx radar signal from the scene due to reflection of the Tx radar signal from one or more objects;

down-converting the Rx radar signal to a complex baseband signal;
a DC compensation method comprising
receiving the complex baseband signal,
analyzing the complex baseband signal to determine a DC component in the complex baseband signal, and
subtracting the determined DC component from the samples of the complex baseband signal to compensate the DC component and to obtain a reconstructed baseband signal; and
extracting phase information from the reconstructed baseband signal representing distance information of the distance between the radar device and the one or more objects.

20. A non-transitory computer-readable recording medium that stores therein a computer program product, which, when executed by a processor, causes the method according to embodiment 14 or 19 to be performed.

21. A computer program comprising program code means for causing a computer to perform the steps of said method according to embodiment 14 or 19 when said computer program is carried out on a computer.

The invention claimed is:

1. A device for determining a DC component in a zero-IF radio receiver, said device comprising:
circuitry configured to
receive a complex base band signal;
analyze the complex baseband signal to determine a DC component in the complex baseband signal by selecting at least three samples of the complex baseband signal and determining the intersection of at least two perpendicular bisectors of at least two straight lines, each straight line running through a different pair of two of said selected samples, said intersection representing the DC component; and
subtract the determined DC component from samples of the complex baseband signal to compensate the DC component and obtain a reconstructed baseband signal.

2. The device as claimed in claim 1, wherein
said circuitry is configured to determine the DC component in the filtered baseband signal by selecting exactly three samples of the complex baseband signal and determining the intersection of exactly two perpendicular bisectors of exactly two straight lines.

3. The device as claimed in claim 2, wherein
said circuitry is configured to determine the DC component in the complex baseband signal by $$DC = \begin{pmatrix} DC_I \\ DC_Q \end{pmatrix} = 1/2 \begin{pmatrix} y_0 - y_1 \\ x_1 - x_0 \end{pmatrix} \frac{(x_2 - x_0)(x_2 - x_1) - (y_2 - y_0)(y_1 - y_2)}{(y_0 - y_1)(x_2 - x_1) - (x_1 - x_0)(y_1 - y_2)} + 1/2 \begin{pmatrix} x_0 + x_1 \\ y_0 + y_1 \end{pmatrix}$$

wherein $(x_0, y_0)$, $(x_1, y_1)$, $(x_2, y_2)$ are the complex coordinates of the selected samples in the IQ plane.

4. The device as claimed in claim 1, wherein
said circuitry is configured to select at least three samples of the complex baseband signal, wherein each two of the selected samples are spaced by at least i samples, i being an integer larger than one.

5. The device as claimed in claim 1, wherein
said circuitry is configured to select at least three samples of the complex baseband signal from at least three different quadrants in the IQ plane.

6. The device as claimed in claim 1, wherein
said circuitry is configured to select at least three samples of the complex baseband signal having a signal level above a predetermined signal level threshold.

7. The device as claimed in claim 1, wherein
said circuitry is configured to select at least three samples of the complex baseband signal by use of an external quality signal.

8. The device as claimed in claim 1, wherein
said circuitry is configured to perform a plausibility check for checking the plausibility of the determined DC component and for skipping a determined DC component in case it is determined to be implausible.

9. The device as claimed in claim 8, wherein
said circuitry is configured to perform said plausibility check by checking if the absolute value of a denominator used in the determination of the DC component is below a predetermined DC component threshold.

10. The device as claimed in claim 1, wherein
said circuitry is configured to perform a weighted low-pass filtering of two or more subsequently determined DC components, wherein the weight is determined based on the reliability and/or plausibility of the respective DC components.

11. The device as claimed in claim 10, wherein
said circuitry is configured to average subsequently determined DC components.

12. The device as claimed in claim 11, wherein
said circuitry is configured to apply moving averaging, moving averaging with selected determined DC components or weighted averaging.

13. A method for determining a DC component in a zero-IF radio receiver, said method comprising:
receiving a complex baseband signal;
analyzing the complex baseband signal to determine a DC component in the complex baseband signal by selecting at least three samples of the complex baseband signal and determining the intersection of at least two perpendicular bisectors of at least two straight lines, each straight line running through a different pair of two of said selected samples, said intersection representing the DC component; and
subtracting the determined DC component from samples of the complex baseband signal to compensate the DC component and obtain a reconstructed baseband signal.

14. A radar system for distance determination, said system comprising:
a radar device configured to transmit a Tx radar signal to a scene and to receive a Rx radar signal from the scene due to reflection of the Tx radar signal from one or more objects;
a down-converter configured to down-convert the Rx radar signal to a complex baseband signal; and
circuitry configured to
receive the complex baseband signal,
analyze the complex baseband signal to determine a DC component in the complex baseband signal,
subtract the determined DC component from samples of the complex baseband signal to compensate the DC component and to obtain a reconstructed baseband signal; and
extract phase information from the reconstructed baseband signal representing distance information of the distance between the radar device and the one or more objects.

15. The radar system as claimed in claim 14, wherein
said circuitry is configured to determine a vital sign of a subject in the scene from phase information in the reconstructed baseband signal caused by periodic motion of one or more body parts.

16. The radar system as claimed in claim 15, wherein
said circuitry is configured to determine the respiration rate and/or the pulse rate of a subject in the scene.

17. A radar method for distance determination, said method comprising:
transmitting a Tx radar signal to a scene;
receiving a Rx radar signal from the scene due to reflection of the Tx radar signal from one or more objects;
down-converting the Rx radar signal to a complex baseband signal;
receiving the complex baseband signal;
analyzing the complex baseband signal to determine a DC component in the complex baseband signal;
subtracting the determined DC component from the samples of the complex baseband signal to compensate the DC component and to obtain a reconstructed baseband signal; and
extracting phase information from the reconstructed baseband signal representing distance information of the distance between the radar device and the one or more objects.

\* \* \* \* \*